United States Patent
Massarella et al.

(10) Patent No.: US 9,729,363 B2
(45) Date of Patent: Aug. 8, 2017

(54) FREQUENCY DISCRIMINATOR

(71) Applicant: CRFS Limited, Cambridge (GB)

(72) Inventors: Alistair Massarella, Cambridge (GB); Daniel Timson, Cambridge (GB); Keith Alexander, Cambridge (GB)

(73) Assignee: CRFS Limited, Cambridge (GB)

( * ) Notice: Subject to any disclaimer, the term of this patent is extended or adjusted under 35 U.S.C. 154(b) by 128 days.

(21) Appl. No.: 14/166,618

(22) Filed: Jan. 28, 2014

(65) Prior Publication Data

US 2015/0072633 A1 Mar. 12, 2015

(51) Int. Cl.
| | | |
|---|---|---|
| *H04L 27/14* | (2006.01) | |
| *G01S 7/02* | (2006.01) | |
| *G01R 23/165* | (2006.01) | |
| *G01S 5/04* | (2006.01) | |
| *G01S 5/06* | (2006.01) | |

(52) U.S. Cl.
CPC ............ *H04L 27/14* (2013.01); *G01R 23/165* (2013.01); *G01S 7/021* (2013.01); *G01S 5/04* (2013.01); *G01S 5/06* (2013.01)

(58) Field of Classification Search
CPC ...... H04L 17/14; H03R 23/165; H03H 11/04; H03H 11/34; H04B 10/142; H04B 10/145; H04B 10/152; H04B 10/155; G01S 5/04; G01S 5/06; G01S 7/021
USPC ............ 455/130, 205, 210, 213, 222, 226.1, 455/226.2, 254, 307, 334, 336, 339, 340; 327/39, 61
See application file for complete search history.

(56) References Cited

U.S. PATENT DOCUMENTS

| | | | |
|---|---|---|---|
| 4,175,256 A | * | 11/1979 | Dolikian .................... 327/61 |
| 4,438,405 A | * | 3/1984 | Yazawa et al. .............. 327/39 |
| 4,547,727 A | | 10/1985 | Tsui et al. |
| 4,633,516 A | | 12/1986 | Tsui |
| 4,791,360 A | | 12/1988 | Gagnon et al. |
| 5,075,619 A | | 12/1991 | Said |
| 5,168,215 A | | 12/1992 | Puzzo |
| 5,365,551 A | | 11/1994 | Snodgrass et al. |
| 5,410,315 A | | 4/1995 | Huber |

(Continued)

FOREIGN PATENT DOCUMENTS

| | | |
|---|---|---|
| EP | 0416692 A2 | 3/1991 |
| EP | 0702323 A2 | 3/1996 |

(Continued)

OTHER PUBLICATIONS

UK Intellectual Property Office Search and Examination Report issued in British Application No. GB1316254.0 dated Feb. 17, 2014.

(Continued)

*Primary Examiner* — Thanh Le
(74) *Attorney, Agent, or Firm* — McCarter & English, LLP; David R. Burns

(57) ABSTRACT

A frequency discriminator comprising a power splitter for splitting a signal into first and second paths, wherein the first path is configured to provide a first, straight-through signal and the second path includes a frequency-dependent element, such as low-pass filter, so as to provide a second signal. The frequency discriminator further comprises a circuit configured to compare the first and second signals and generate an instantaneous frequency signal in dependence thereon.

39 Claims, 15 Drawing Sheets

(56) References Cited

U.S. PATENT DOCUMENTS

| | | | |
|---|---|---|---|
| 5,574,360 A | 11/1996 | Richardson | |
| 6,172,596 B1 | 1/2001 | Cesar et al. | |
| 6,914,946 B1* | 7/2005 | Horvat et al. | ............... 375/334 |
| 2006/0023679 A1 | 2/2006 | Twitchell | |
| 2006/0071758 A1 | 4/2006 | Cooper et al. | |
| 2010/0029235 A1* | 2/2010 | Bouillet | .................... 455/226.2 |

FOREIGN PATENT DOCUMENTS

| | | |
|---|---|---|
| EP | 0768540 A1 | 4/1997 |
| EP | 0924635 A2 | 6/1999 |
| GB | 600073 A | 3/1948 |
| GB | 1485880 A | 9/1977 |
| GB | 2191368 A | 12/1987 |
| GB | 2282501 A | 4/1995 |
| JP | 2006113049 A | 4/2006 |
| WO | 2005/078633 A1 | 8/2005 |
| WO | 2009/088538 A1 | 7/2009 |
| WO | 2010/049686 A1 | 5/2010 |

OTHER PUBLICATIONS

P.L. Herselman and J.E. Cilliers, "A Digital Instantaneous Frequency Measurement Technique using High-Speed Analogue-to-Digital Converters and Field Programmable Gate Arrays," A DIFM Technique Using High-Speed ADC's and FPGA's, Sep. 2007.
International Search Report and Written Opinion issued in International Application No. PCT/GB2014/052697, mailed Dec. 19,2014.
International Search Report issued in Application No. GB1116320.1, dated Jan. 6, 2012.
International Search Report issued in Application No. PCT/GB2012/052314, dated Sep. 20, 2012, mailed Jan. 4, 2013.

* cited by examiner

FREQUENCY DISCRIMINATOR

RELATED APPLICATIONS

This application is a 35 U.S.C. §119 National Stage filing of Great Britain Application No. GB1316254.0 filed on Sep. 9, 2013. The entire contents of the foregoing application are explicitly incorporated herein by reference.

FIELD OF THE INVENTION

The present invention relates to a frequency discriminator. The present invention also relates to a detector which employs one or more frequency discriminators. The present invention further relates to a system which uses one or more detectors which employ one or more frequency discriminators.

BACKGROUND

In many applications, such as radar warning receivers (RWRs), there is a need to detect short-pulse signals with high probability.

Frequency-swept detectors and spectrum monitors are not well-suited to being short-pulse signal detectors since they suffer low dwell times in each frequency band.

Short-pulse signals can be detected using a digital instantaneous frequency measurement (IFM) technique based on an analogue frequency discriminator and reference is made to P. L. Herselman and J. E. Cilliers: "A Digital Instantaneous Frequency Measurement Technique using High-Speed Analogue-to-Digital Converters and Field Programmable Gate Arrays" (2007). A conventional frequency discriminator typically comprises a splitter, a delay line, a mixer and a low-pass filter. Using the splitter, delay line and mixer, an input signal is mixed with a delayed copy. The product is fed through a low-pass filter. The frequency of a single input tone can be found using a look-up table. However, one drawback of such a system is that it can "blinded" by an extra input tone. Another drawback is that such a system tends to suffer from having a limited dynamic range.

SUMMARY

The present invention seeks to provide an improved frequency discriminator for use in IFM.

According to a first aspect of the present invention there is provided a frequency discriminator. The frequency discriminator comprises a power splitter for splitting a signal into first and second paths. The first path is configured to provide a first, straight-through signal and the second path includes a frequency-dependent element, such as a low-pass filter, so as to provide a second signal. The frequency discriminator further comprises a circuit configured to compare the first and second signals and generate an instantaneous frequency signal in dependence thereon.

Using a frequency-dependent element, such as a low-pass filter, and a comparison circuit can help to realise a simple and/or cheap frequency discriminator.

The frequency-dependent element may be a linear filter. The frequency-dependent element may be a low-pass filter. The low-pass filter may have a corner frequency of at least 500 MHz. The frequency-dependent element may be a high-pass filter. The frequency-dependent element may be a Bessel filter. This can help realise a frequency discriminator having a frequency-to-voltage characteristic that is substantially linear over several octaves of frequency The second path may comprise two or more frequency-dependent elements in series, e.g. two or more low-pass filters (having the same or similar responses) in series. This can be used to provide a stronger frequency-dependency, e.g. a filter with a steeper slope.

The circuit may comprise a first amplifier configured to amplify the first signal and a second amplifier configured to amplify the second signal. The first and second amplifiers may have a rise/fall time which is no more than 10 ns. Using amplifiers which have fast rise and fall times can help to provide a frequency discriminator capable of detecting pulses with narrow pulse width and short response time.

A comparator can be used to subtract the output of one amplifier from the other. The comparator may be an analogue comparator or a digital comparator. The digital comparator may be part of a processor.

The first and second amplifiers may be first and second logarithmic amplifiers respectively. Subtracting one logarithmic value from another is equivalent to taking a ratio of linear values. Using logarithmic amplifiers can help to provide a frequency discriminator which has a wide dynamic range.

The circuit may include an integrated circuit comprising the first and second amplifiers. This can help achieve good temperature stability.

The circuit may comprise a differential amplifier which is configured to compare the first and second signals or third and fourth signals obtained from the first and second signals respectively, for example amplified first and second signals.

The circuit may be configured to output an instantaneous amplitude signal. The frequency discriminator may further comprise an analogue-to-digital converter arranged to sample the instantaneous amplitude signal.

The frequency discriminator may further comprise an analogue-to-digital converter arranged to sample the instantaneous frequency signal The frequency discriminator may be a wideband frequency discriminator.

The frequency discriminator may further comprise a limiting amplifier configured to receive an input signal and output the signal to the power splitter. This can allow a low-pass filter having a steeper roll-off to be used.

The frequency discriminator may be sensitive to signals in a bandwidth between a lower frequency limit and an upper frequency limit, wherein the upper frequency limit is at least 10 GHz or at least 40 GHz.

The power splitter may be a first power splitter, the frequency-dependent element may be a first frequency-dependent element, the circuit may be a first circuit and the instantaneous frequency signal may be a first instantaneous frequency signal. The frequency discriminator may further comprise a second power splitter for splitting a signal into third and fourth paths, wherein the third path is configured to provide a fifth, straight-through signal and the fourth path includes a second frequency-dependent element so as to provide a sixth signal, and a second circuit configured to compare the fourth and fifth signals and generate a second instantaneous frequency signal in dependence thereon and a third power splitter configured to split an input signal and feed the input signal to the first and second power splitters, and the first and second frequency-dependent elements have different frequency dependencies.

The first and second frequency-dependent elements may both comprise low-pass filters or high-pass filters having different cut off frequencies.

The first frequency-dependent element may be a low-pass filter and the second frequency-dependent element may be a high pass filter.

The second frequency-dependent element may be a linear filter. The second frequency-dependent element may be a low-pass filter. The second low-pass filter may have a corner frequency of at least 500 MHz. The second frequency-dependent element may be a high-pass filter. The second frequency-dependent element may be a Bessel filter. The fourth path may comprise two or more frequency-dependent elements in series, e.g. two or more low-pass filters (having the same or similar responses) in series.

The second circuit may comprise a third amplifier configured to amplify the fifth signal and a fourth amplifier configured to amplify the sixth signal. The third and fourth amplifiers may have a rise/fall time which is no more than 10 ns. A second comparator can be used to subtract the output of one amplifier from the other. The second comparator may be an analogue comparator or a digital comparator. The third and fourth amplifiers may be third and fourth logarithmic amplifiers respectively. The second circuit may include an integrated circuit comprising the first and second amplifiers. The second circuit may comprise a differential amplifier which is configured to compare the fifth and sixth signals or seventh and eighth signals obtained from the fifth and sixth signals respectively, for example amplified fifth and sixth signals.

The second circuit may be configured to output a second instantaneous amplitude signal. The frequency discriminator may further comprise an analogue-to-digital converter arranged to sample the second instantaneous amplitude signal. The frequency discriminator may further comprise an analogue-to-digital converter arranged to sample the instantaneous frequency signal.

The frequency discriminator may comprise a third comparator for comparing the first and second instantaneous frequency signals.

According to a second aspect of the present invention there is provided a detector comprising a power splitter for splitting a signal into at least two paths, each path including a frequency discriminator and at least one processor configured to process signal(s) from the at least one frequency discriminator.

Thus, the frequency discriminator can be used in larger systems, for example, multiband systems.

The at least one processor may comprise at least one central processing unit (CPU). The at least one processor may comprise at least one field-programmable gate array (FPGA), at least one application-specific integrated circuit (ASIC), at least one microcontroller and/or at least one other integrated circuit.

Each path may include a filter for selecting a respective frequency range. The detector may comprise at least one band pass filter. The detector may comprise a plurality of band pass filters. One or more, or each, of the band-pass filters may have a bandwidth less than one octave (i.e. $f_H < 2f_L$ where $f_H$ is the upper cut-off frequency and $f_L$ is the lower cut-off frequency). This can help to reject harmonics. One or more, or each, of the band-pass filters may have a bandwidth of between 2 and 4 GHz, for example, 3 GHz.

Each path may include an amplifier arranged to saturate at a given input level. Thus, a substantial proportion of dynamic range of a frequency discriminator can arise from frequency discrimination.

The detector may further comprise an input section for receiving an input signal and providing the signal to the detector power splitter. The input section may comprise a high-pass filter. The high-pass filter may have a cut-off frequency of 1 GHz. The input section may comprise a power limiter. The power limiter may be a two-stage low noise amplifier (LNA) arrangement.

According to a third aspect of the present invention there is provided a system comprising a detector and a receiver. The detector is configured, in response to receiving a signal which includes component at a predetermined frequency, to identify the frequency and to cause the receiver to tune to a frequency band which includes the frequency.

The system may further comprise at least one further processor configured to characterise the signal and, in response to characterising the signal, to generate a pulse descriptor word. The system may further comprise at least one antenna coupled to the detector and the receiver. The system may be or be comprised in a radar warning receiver system.

According to a fourth aspect of the present invention there is provided a vehicle, such as an aircraft or ship, including the system.

According to a fifth aspect of the present invention there is provided a detection device comprising at least two detectors, each detector arranged to output a corresponding power level of an input signal and at least one processor configured to receive at least two measurements of power levels from respective detectors and to determine an angle of arrival.

The detection device may further comprise at least two antennas, each antenna coupled to a respective detector.

According to a sixth aspect of the present invention there is provided a system comprising a plurality of spaced detection devices and a controller, such as a computer, for receiving measurements of angle of arrival from one or more detection devices and which is configured to determine position of a signal source from measurements of angle of arrival.

According to seventh aspect of the present invention there is provided a detection device comprising a detector and a processor configured to measure a time of arrival of a pulse received by the detector.

According to an eighth aspect of the present invention there is provided a system comprising a plurality of spaced detection devices and a controller for receiving measurements of time of arrival from one or more detection devices and which is configured to determine position of a signal source from measurements of time of arrival.

According to a ninth aspect of the present invention there is provided a detection device comprising a detector, a receiver for capturing a sample of a signal and at least one processor. The detector is configured, in response to receiving a signal, to cause the receiver to capture a sample of the signal.

The at least one processor may be configured to measure a time of arrival of a pulse received by the detector.

According to a tenth aspect of the present invention there is provided a system comprising a plurality of spaced detection devices and a controller for receiving measured samples from one or more detection devices and which is configured to determine position of a signal source from the samples based on time difference of arrival.

The controller may be configured to determine position of the signal source from measurements of time of arrival.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
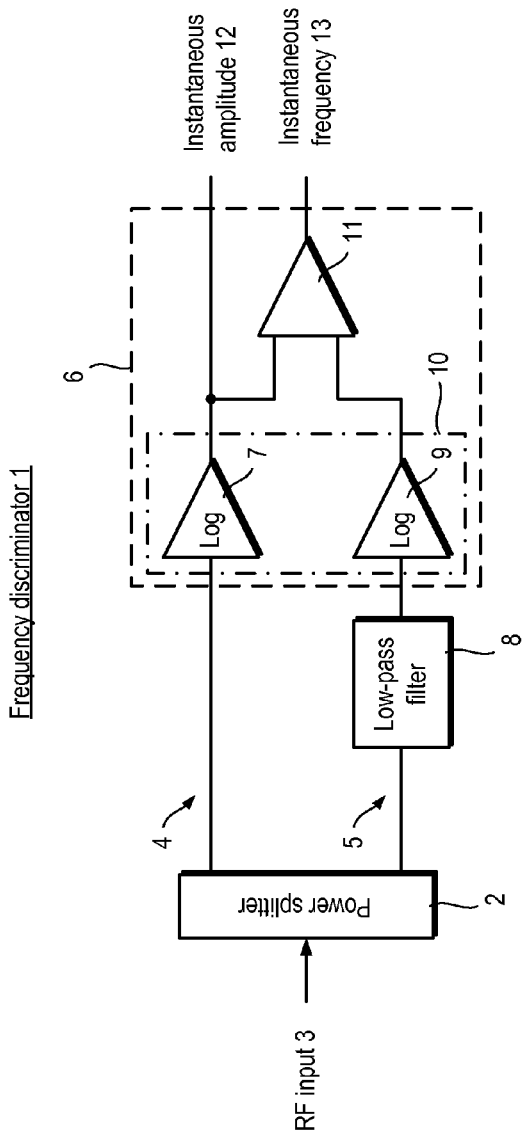
FIG. 1 is a schematic block diagram of a frequency discriminator.

Referring to FIG. 1, a frequency discriminator 1 is shown.

The frequency discriminator 1 includes a power splitter 2 which splits an RF signal 3 received from an antenna or other source and passes the RF signal (herein also referred to as the "input signal") into first and second paths 4, 5 which feed into a comparison circuit 6.

The first path 4 feeds the input signal directly into a first logarithmic amplifier 7 (such as a Hittite® HMC648LP3E Logarithmic detector). The second path 5 includes a low-pass filter 8 having a cut-off frequency, $f_C$, which filters the input signal. The second path 5 feeds the filtered input signal into a second logarithmic amplifier 9. The low-pass filter 8 is provided by a Bessel filter (such as a TriQuint® TGB2010-SM 5 to 9 GHz Bessel filter). A single chip, dual-channel logarithmic amplifier (such as an Analog Devices® ADL5519) 10 can be used to provide the first and second logarithmic amplifiers 7, 9. Outputs of the first and second logarithmic amplifiers 7, 9 are fed into inputs of a differential amplifier 11 which provides an output signal 13 which is a measurement of instantaneous frequency. The output 12 of the first logarithmic amplifier 7 is a measurement of instantaneous amplitude.

Figure 2:
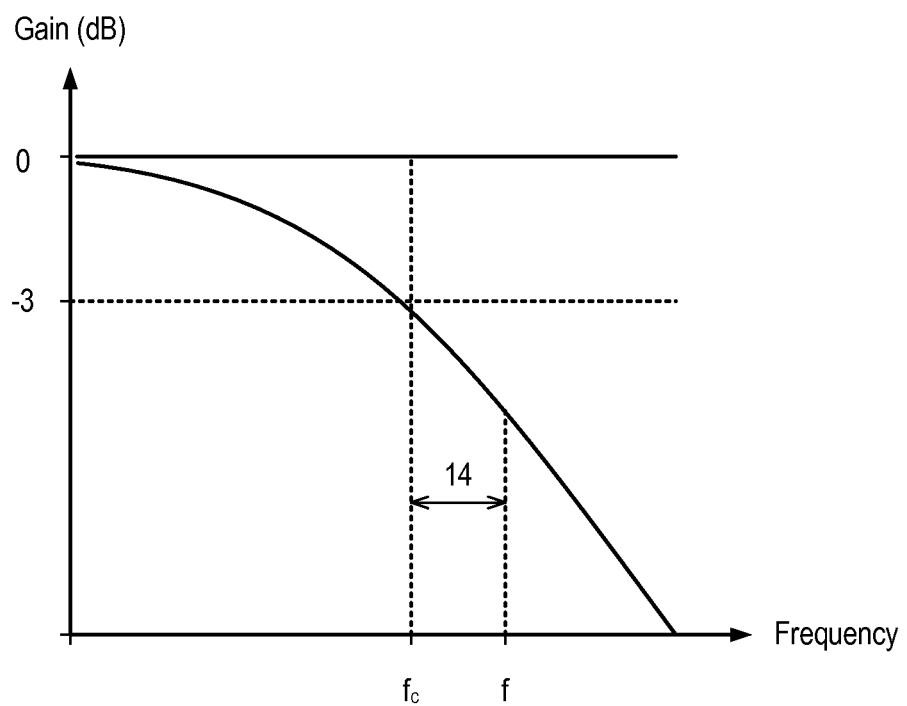
FIG. 2 is a plot of amplitude against frequency of a low-pass filter.

Referring also to FIG. 2, the output signal 13 does not vary significantly according to the amplitude of the input signal. However, the output signal varies significantly with frequency. In particular, the amplitude of a frequency component in the output signal is proportional to the difference 14 between frequency f (above cut-off) and the cut-off frequency, $f_C$.

Thus, the low-pass filter 8 can be used to impart amplitude variation which depends on frequency, while the comparison circuit 6 can be used to generate a frequency-dependent output 13 that is largely independent of the amplitude of the input signal 3.

Figure 1A:
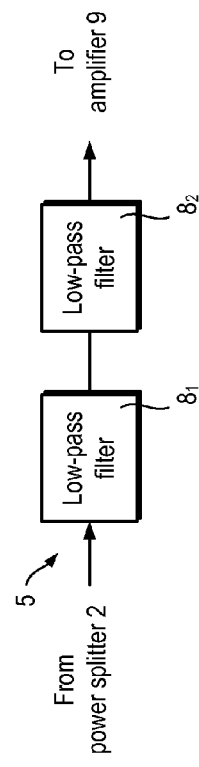
FIG. 1a illustrates a path including two low-pass filters in series.

Referring to FIG. 1a, the second path 5 may include two or more low-pass filters $8_1$, $8_2$ in series. This may be used to provide a steeper slope, i.e. greater frequency dependency.

Low-pass filter(s) need not be used. Other forms for frequency-dependent elements can be used instead. For example, a high-pass filter may be used. The element preferably exhibits monotonicity.

Figure 3:
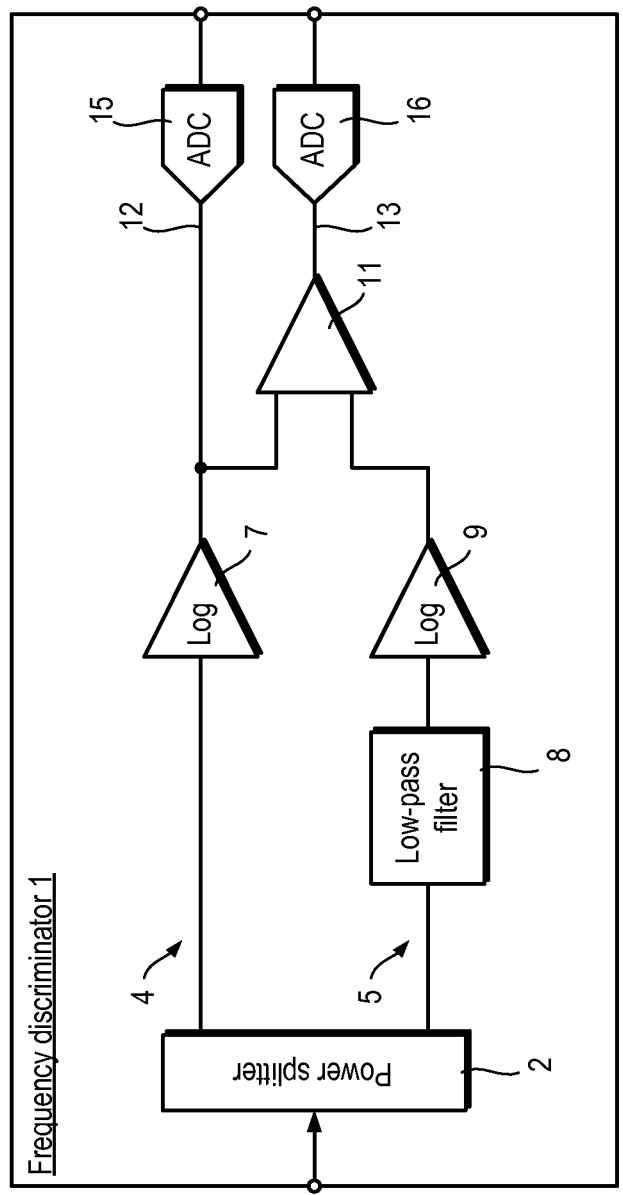
FIG. 3 is a schematic block diagram of a frequency discriminator which includes analogue-to-digital converters.

Referring to FIG. 3, the instantaneous amplitude and instantaneous frequency signals 12, 13 can be sampled using a pair of analogue-to-digital converters 15, 16, preferably using the same sample clock. The resulting digital samples can be passed to a data processing system. However, the output signals do not need to be sampled. Instead, the analogue signals can be processed at system level.

There is a trade-off between how much of the dynamic range of each logarithmic amplifier 7, 9 is used to perform the frequency discrimination and how much is used to make the output insensitive to input amplitude variations. A limiting amplifier (not shown) can be used to reduce large variations in the input signal 3.

Figure 4:
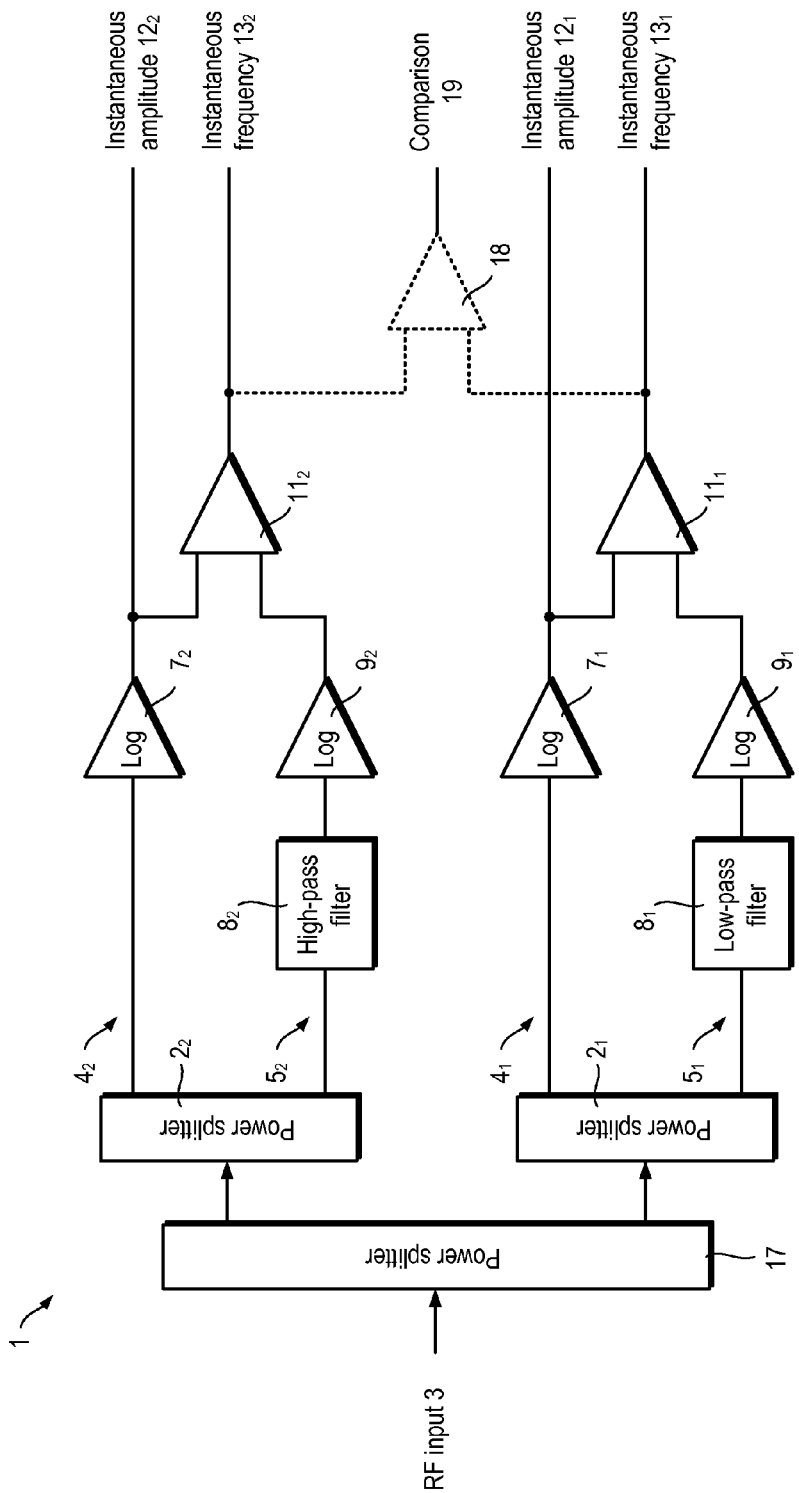
FIG. 4 is a schematic block diagram of a collision detector which includes first and second frequency discriminators.

Referring to FIG. 4, frequency discriminator 1 may be configured for frequency collision detection.

The frequency discriminator 1 comprises a first power splitter 21, first and second paths $4_1$, $5_1$, first and second amplifiers $7_1$, $9_1$, a first frequency-dependent element $8_1$ which is in the form of a low-pass filter and a first comparator $11_1$ arranged in the same way as the frequency discriminator 1 shown in FIG. 1.

The frequency discriminator 1 also comprises a second power splitter $2_2$, third and fourth paths $4_2$, $5_2$, third and fourth amplifiers $7_1$, $9_1$, a second frequency-dependent element $8_2$ which is in the form of a high-pass filter and a second comparator $11_1$ arranged in the same way as the frequency discriminator 1 shown in FIG. 1.

As shown in FIG. 4, the frequency discriminator 1 includes a power splitter 17 which supplies the input signal 3 to the first and second power splitters $2_1$, $2_2$. A single power splitter can replace the first, second and third power splitters.

The instantaneous frequency signals $13_1$, $13_2$ can be supplied to an optional comparator 18 which outputs a comparison signal 19.

When a signal 3 is received that includes two superposed (i.e. colliding) frequencies, the comparator 18 outputs a non-zero signal 19.

The instantaneous frequency and amplitude signals $12_1$, $12_2$, $13_1$, $13_2$ and, if a comparator 18 is used, the comparison signal 19 can be sampled using respective analogue-to-digital converters (not shown).

At least one processor (not shown) may be used to perform the comparison of the instantaneous frequency signals in the digital domain. Thus, the comparator 18 may be omitted.

One or more frequency discriminators 1 can be incorporated into larger devices and systems, such as radar warning receivers (RWR), electronic countermeasures (ECM) and electronic intelligence (ELINT) systems, as will now be described with reference to FIGS. 5 to 15.

Figure 5:
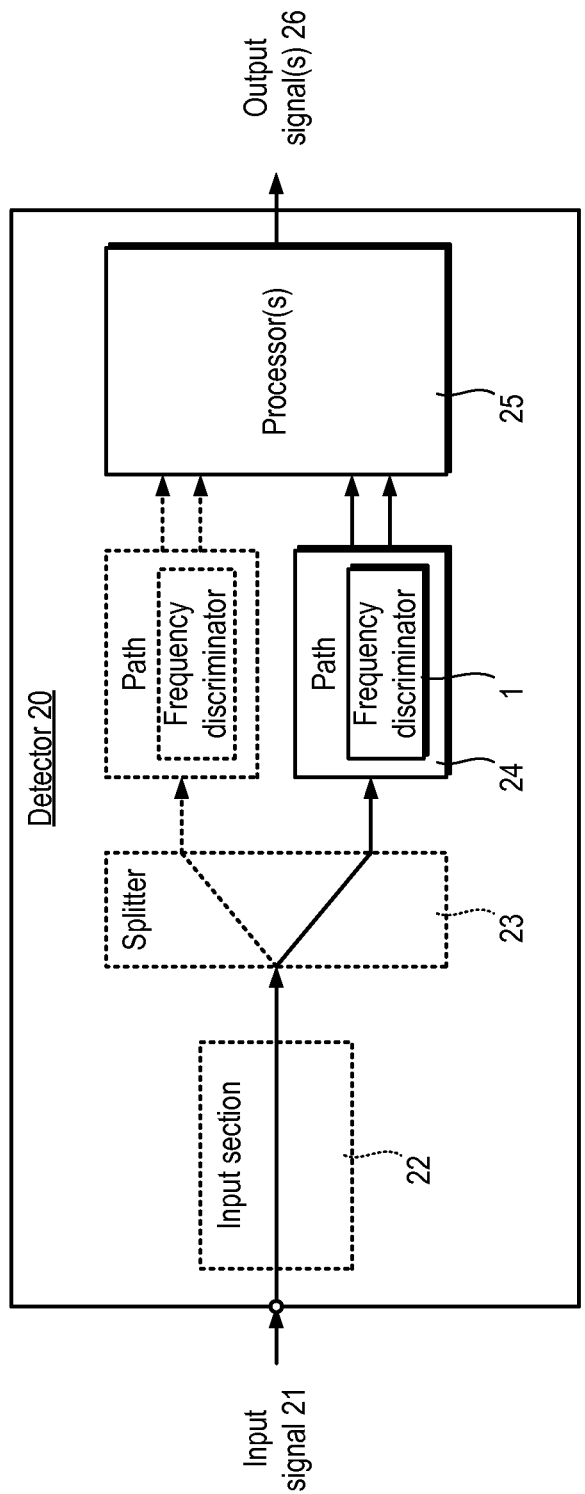
FIG. 5 is a schematic block diagram of a detector.

Referring to FIG. 5, a detector 20 is shown. The detector 20 receives an input signal 21 which can be a combination of different signals. The detector 20 includes an optional input section 22 which can, for example filter and/or limit the input signal 21, an optional power splitter 23 for splitting the input signal 21, one or more paths 24, each path including a frequency discriminator 1, and one or more processors 25 which carry out signal processing of the outputs of each path 24 and output one or more output signals 26.

The processor(s) 25 may comprise one or more programmable central processing units (CPUs) capable of executing code read from a non-transitory medium or memory to perform the function and operations taught herein. The processor(s) 25 may be provided in microcontroller(s). The processor(s) 25 may include one or more circuits or circuitry, for example, field-programmable gate arrays (FPGAs) or application-specific integrated circuit(s) configurable or programmable to perform the functions and operations taught herein. The processor(s) 25 may include a combination of one or more programmable CPUs and one or more configurable circuits or circuitry to perform the functions and operations taught herein.

Figure 6:
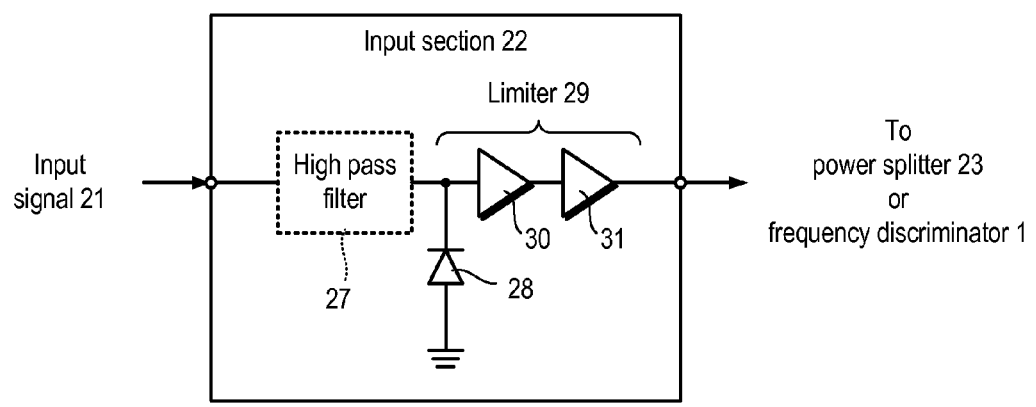
FIG. 6 is a schematic diagram of an optional input section of the detector shown in FIG. 5.

Referring to FIG. 6, the input section 22 is shown in more detail. The input section 22 includes an optional high-pass filter 27, for example, having a cut-off frequency $f_C$ of 1 GHz. The input section 22 includes a diode 28 to ground which provides protection against overload and a power limiter 29 comprising, for example, first and second low-noise amplifiers (LNA) 30, 31 arranged in series.

Figure 7:
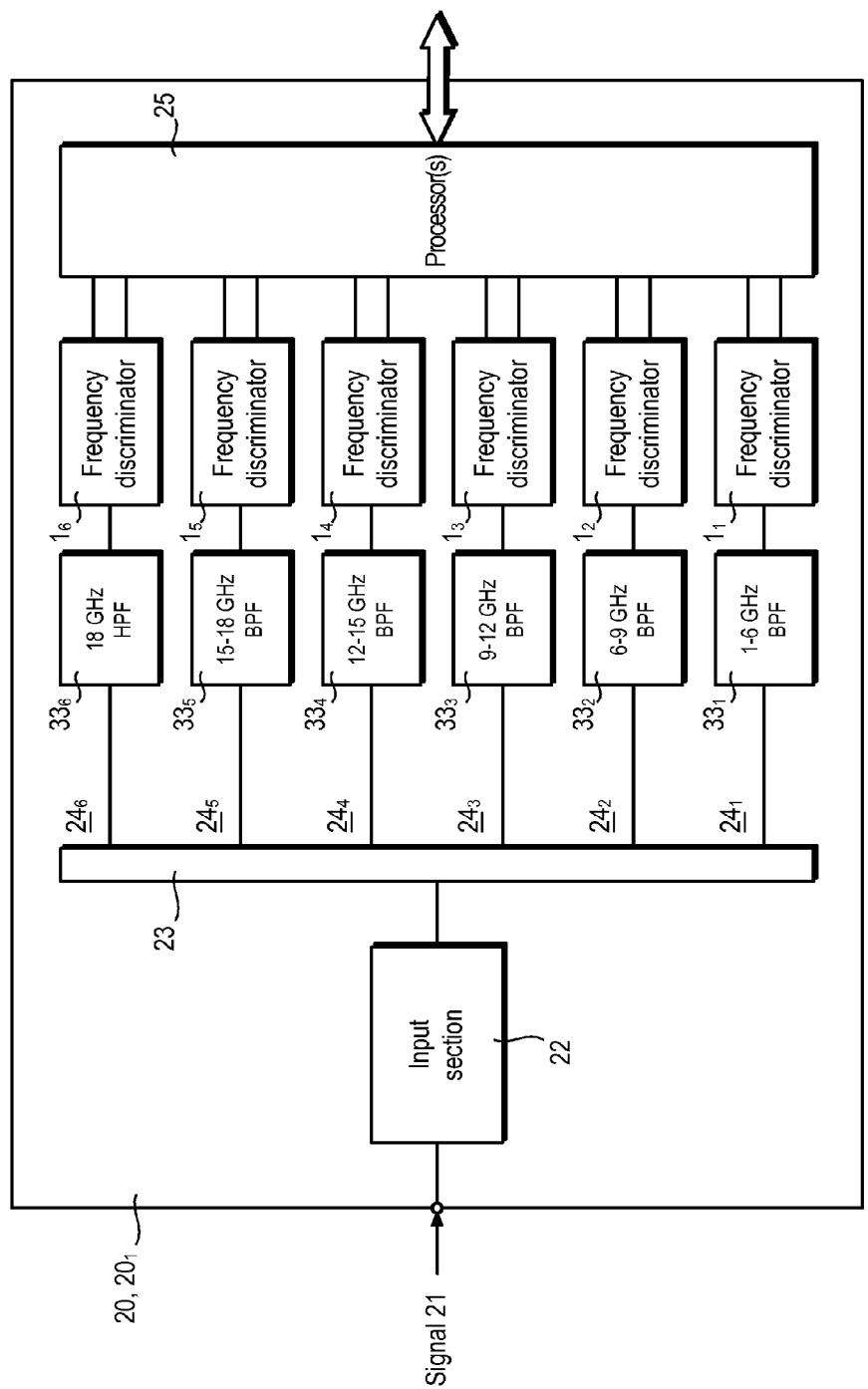
FIG. 7 is a schematic block diagram of a first detector which includes a plurality of paths, each path including a filter and a frequency discriminator.

Referring to FIG. 7, the detector 20 may take the form of a multi-band detector $20_1$ which includes an input section 22, a power splitter 23 and multiple paths 24.

As shown in FIG. 7, the output of the input section 22 is fed into the power splitter 23 which splits the signal into first, second, third, fourth, fifth and sixth paths $24_1$, $24_2$, $24_3$, $24_4$, $24_5$, $24_6$.

Each path $24_1$, $24_2$, $24_3$, $24_4$, $24_5$, $24_6$ includes a respective filter $33_1$, $33_2$, $33_3$, $33_4$, $33_5$, $33_6$ for selecting a respective frequency band.

The first, second, third, fourth and fifth filters $33_1$, $33_2$, $33_3$, $33_4$, $33_5$ in the first, second, third, fourth and fifth paths $24_1$, $24_2$, $24_3$, $24_4$, $24_5$ respectively are band-pass filters. The first filter $33_1$ may be a low pass filter. Preferably, each band-pass filter $33_1$, $33_2$, $33_3$, $33_4$, $33_5$ has a bandwidth less than one octave (i.e. $f_H < 2f_L$ where $f_H$ is the upper cut-off frequency and $f_L$ is the lower cut-off frequency) to reject harmonics from limiter 28 (FIG. 6). The first, second, third, fourth and fifth filters $33_1$, $33_2$, $33_3$, $33_4$, $33_5$ have pass bands of 1 to 6 GHz, 6 to 9 GHz, 9 to 12 GHz, 12 to 15 GHz and 15 to 18 GHz respectively. A sixth filter $33_6$ in the sixth path $24_6$ is a high-pass filter having a cut off frequency of 18 GHz.

Other passbands can be used, e.g. starting at a lower or higher lowest frequency (such as 5 or 7 GHz instead of 6 GHz) and/or going up to a lower or higher highest frequency (such as 17 or 19 GHz instead of 18 GHz). Narrower or wider passbands may be used, e.g. 2 GHz or 4 GHz instead of 3 GHz. The passband width need not be the same for all filters and/or the passbands need not necessarily form a contiguous band.

The output of each filter $33_1$, $33_2$, $33_3$, $33_4$, $33_5$, $33_6$ is fed into a corresponding frequency discriminator $1_1$, $1_2$, $1_3$, $1_4$, $1_5$, $1_6$.

Each frequency discriminator $1_1$, $1_2$, $1_3$, $1_4$, $1_5$, $1_6$ has a low-pass filter 8 (FIG. 4) that has a cut-off frequency, $f_C$, selected according to the band. First, second, third, fourth and fifth discriminators $1_2$, $1_2$, $1_3$, $1_4$, $1_5$ have respective cut-off frequencies, $f_C$, that are the same or about the same (e.g. ±10%) as the lower cut-off frequency, $f_L$, of the band pass filter $33_1$, $33_2$, $33_3$, $33_4$, $33_5$ which feeds that discriminator. A sixth discriminator 16 has a low-pass filter 8 (FIG. 3) that has a cut-off frequency, $f_C$, which is the same or about the same as the upper cut-off frequency of the highest-frequency band pass filter, i.e. the fifth band-pass filter $33_5$.

Thus, each frequency discriminator $1_1$, $1_2$, $1_3$, $1_4$, $1_5$, $1_6$ is sensitive to a different band.

As shown in FIG. 7, the outputs of the frequency discriminators $1_1$, $1_2$, $1_3$, $1_4$, $1_5$, $1_6$ are fed into the processor(s) 25, for example, to perform pulse detection.

Figure 8:
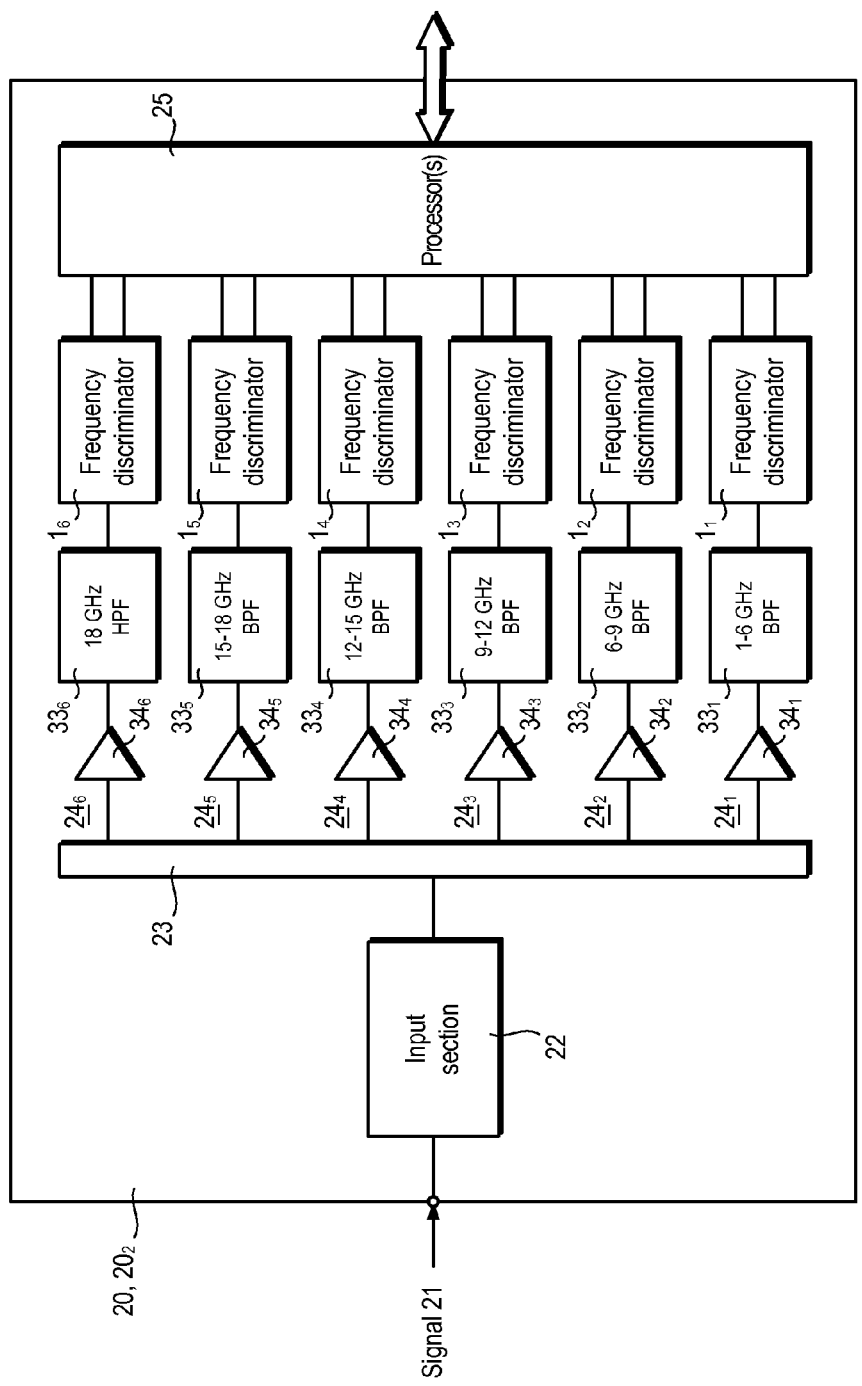
FIG. 8 is a schematic block diagram of a second detector which includes a plurality of paths, each path including a power-limiting amplifier, a filter and a frequency discriminator.

Referring to FIG. 8, the detector 20 may take the form of a multi-band detector $20_2$ which includes an input section 22, a power splitter 23 and multiple paths 24 which includes pre-clamped frequency discriminators $1_1$, $1_2$, $1_3$, $1_4$, $1_5$, $1_6$.

The multi-band detector $20_2$ is the same as the multi-band detector $20_1$ shown in FIG. 7 except that each path $24_1$, $24_2$, $24_3$, $24_4$, $24_5$, $24_6$ includes a respective power-limiting amplifier $34_1$, $34_2$, $34_3$, $34_4$, $34_5$, $34_6$ (such as a TriQuint® TGM2543-SM 4-20 GHz Limiter/Low Noise Amplifier) arranged between the power splitter 23 and the filters $33_1$, $33_2$, $33_3$, $33_4$, $33_5$, $33_6$.

The gains of the amplifiers $34_1$, $34_2$, $34_3$, $34_4$, $34_5$, $34_6$ are set to saturate at a given output level (for example 22 dBm) for an input level which equals or exceeds a given level (for example 10 dBm) and can be adjusted according to the expected or measured signal level. The levels need not be the same for all the amplifiers $34_1$, $34_2$, $34_3$, $34_4$, $34_5$, $34_6$. Thus, an amplified signal is provided to each frequency discriminator $1_1$, $1_2$, $1_3$, $1_4$, $1_5$, $1_6$ such that most of the dynamic response arises from frequency discrimination.

Figure 9:
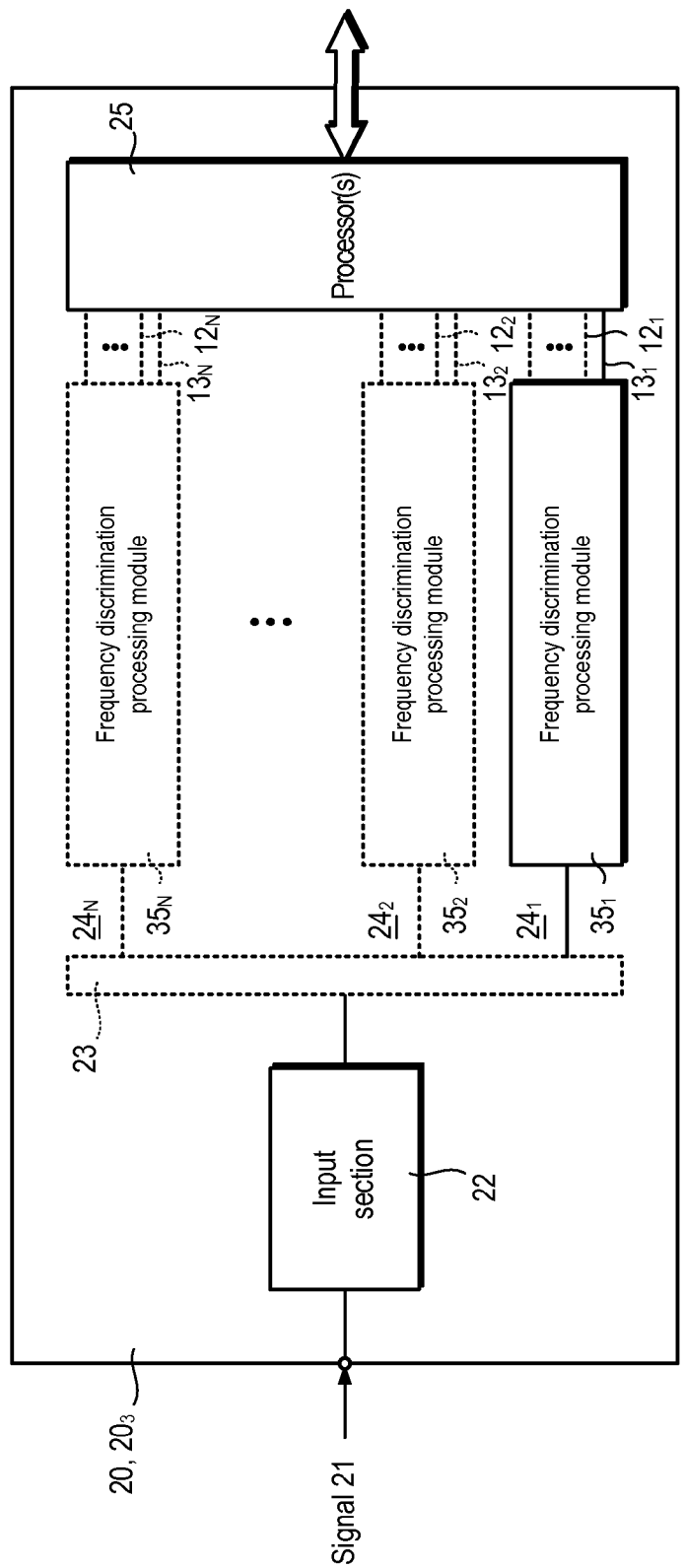
FIG. 9 is a schematic block diagram of a third detector which includes one or more frequency discriminator processing modules.

Referring to FIG. 9, the detector 20 may take the form of a detector $20_3$ which includes an input section 22, an optional power splitter 23 and one or more paths $24_1$, $24_2$, ... $24_N$. Each path $24_1$, $24_2$, ... $24_{N_{35}}$ includes a respective frequency discrimination processing module $35_1$, $35_2$, ..., $35_N$ which outputs at least instantaneous frequency signal $13_1$ and, optional, at least instantaneous amplitude signal $12_1$. Other signals may be output.

Figure 10:
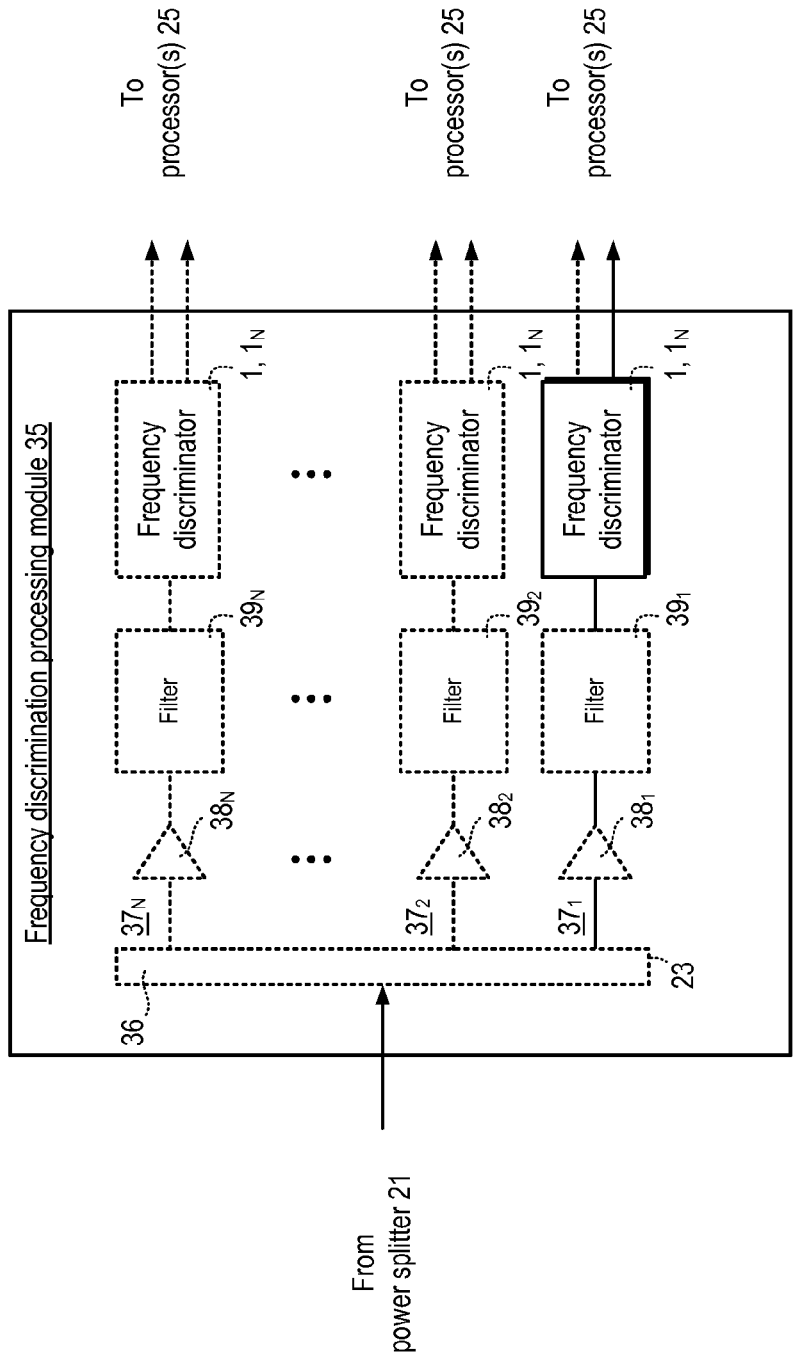
FIG. 10 is a schematic block diagram of a frequency discriminator processing module shown in FIG. 9.

Referring also to FIG. 10, each frequency discrimination processing module $35_1$, $35_2$, ..., $35_N$ may include a power splitter 36 and one or more paths $37_1$, $37_2$, ..., $37_N$.

Each path $37_1$, $37_2$, ..., $37_N$ may include a power-limiting amplifier $38_1$, $38_2$, ..., $38_N$, a filter $39_1$, $39_2$, ..., $39_N$ (which may be a low-pass filter, a band pass filter or a high-pass filter) and a discriminator $38_1$, $38_2$, ..., $38_N$. Thus, the detector $20_3$ can be arranged to be sensitive to different bands and/or power levels.

Figure 11:
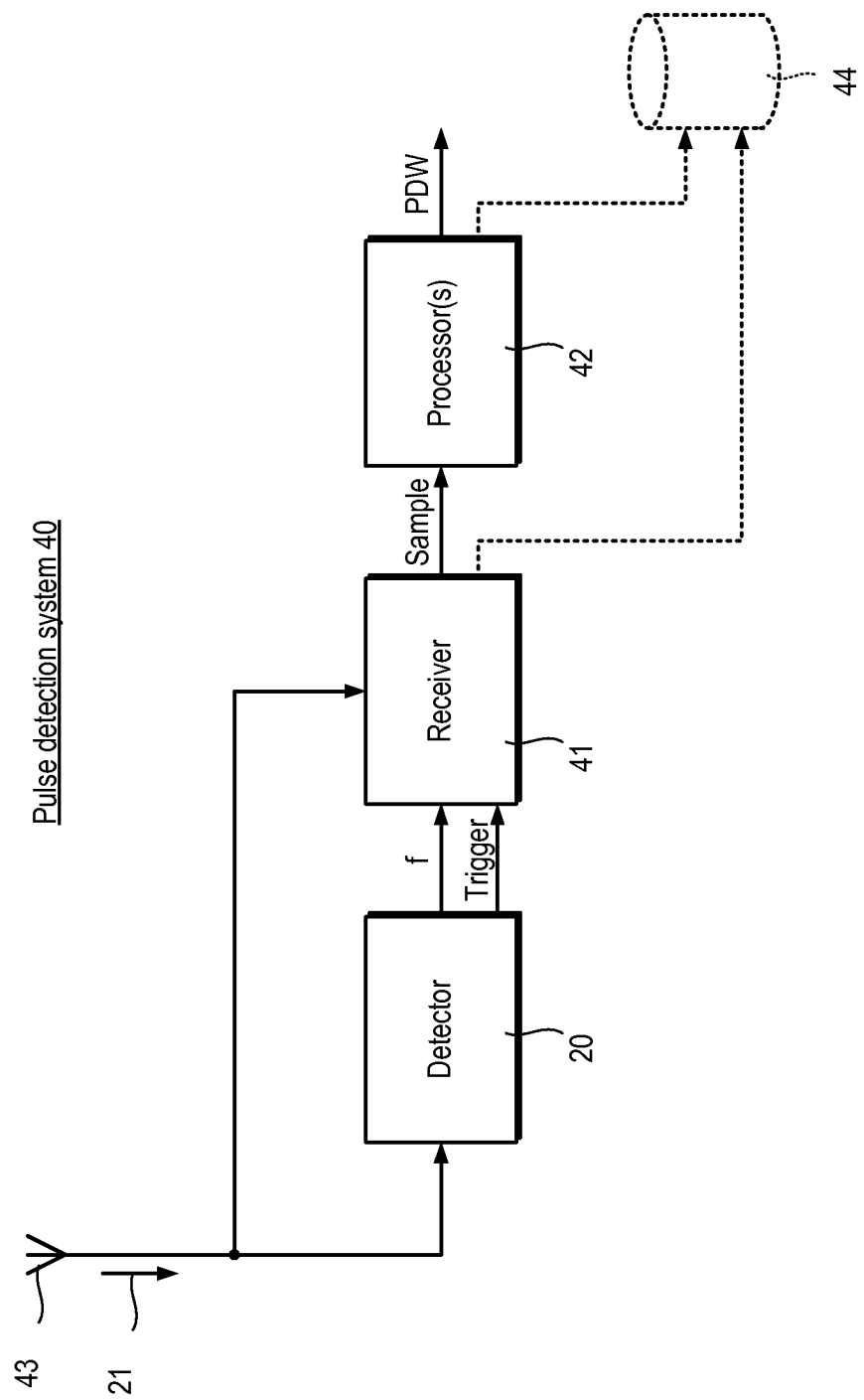
FIG. 11 is a schematic block diagram of a pulse detection system.

Referring to FIG. 11, a pulse detection system 40 is shown.

The system 40 includes a detector 20 which may include one frequency discriminator 1 or a bank of frequency discriminators 1, a tuneable receiver 41 (such as CRFS® RFeye® Node) and at least one processor 42.

The processor(s) 42 may comprise one or more programmable central processing units (CPUs) capable of executing code read from a non-transitory medium to perform the function and operations taught herein. The processor(s) 42 may be provided by microcontroller(s). The processor(s) 42 may include one or more circuits or circuitry, for example, FPGAs or ASIC(s) configurable or programmable to perform the functions and operations taught herein. The processor(s) 42 may include a combination of one or more programmable CPUs and one or more configurable circuits or circuitry to perform the functions and operations taught herein.

As shown in FIG. 11, an antenna 43 feeds an RF signal 21 to both the detector 20 and the receiver 41.

The detector 20 is wideband and has a high probability of intercept. The receiver 41 has higher sensitivity and good frequency resolution. However, it may have a slower response and lower probability of intercept. The detector 20 can be used to trigger capture of the detected signal 21 by the receiver 41. The receiver 41 can capture the signal by in-phase and quadrature (IQ) time sampling or by spectrum analysis.

On detecting a signal at a particular frequency, f, the detector 20 commands the receiver 41 to tune to a band containing that frequency and to capture the remaining part of the signal pulse.

The sample can be fed into the processor(s) 42 to identify the signal and produce a pulse descriptor word (PDW). Characteristics such as pulse repetition rate and pulse width can be measured.

The system 40 may also include storage 44 for storing the captured sample and/or the pulse descriptor word.

Figure 12:
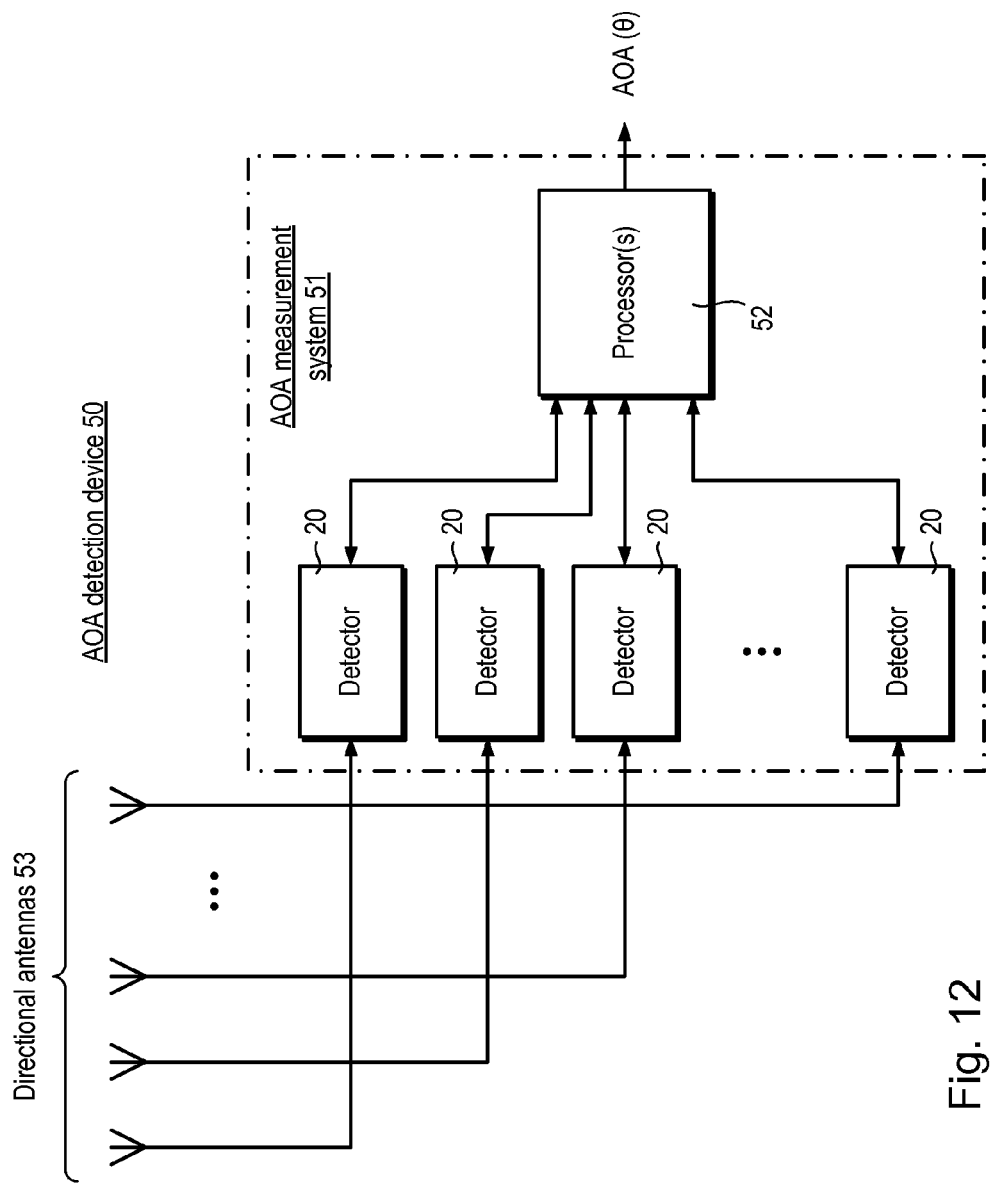
FIG. 12 is a schematic block diagram of an angle-of-arrival (AOA) detection device.

Referring to FIG. 12, an angle-of-arrival (AOA) detection device 50 is shown.

The AOA detection device 50 comprises an AOA measurement system 51 which includes a set of detectors 20 and a processor 52 and a set of directional antennas 53 arranged to provide up to 360-degree around a vertical axis (not shown). There may be 6 or 8 antennas. Each detector 20 is fed by a respective antenna 53.

The processor(s) 52 may comprise one or more programmable CPUs capable of executing code read from a non-transitory medium to perform the function and operations taught herein. The processor(s) 52 may be included in a microcontroller. The processor(s) 52 may include one or more circuits or circuitry, for example, FPGA(s) or ASIC(s) configurable or programmable to perform the functions and operations taught herein. The processor(s) 52 may include a combination of one or more programmable CPUs and one or more configurable circuits or circuitry to perform the functions and operations taught herein.

The detectors 20 operate simultaneously feeding amplitude values into the processor(s) 52. The processor(s) 52 compare the received power levels from each detector 20 to estimate the angle of arrival (AOA) of the signal.

Figure 13:
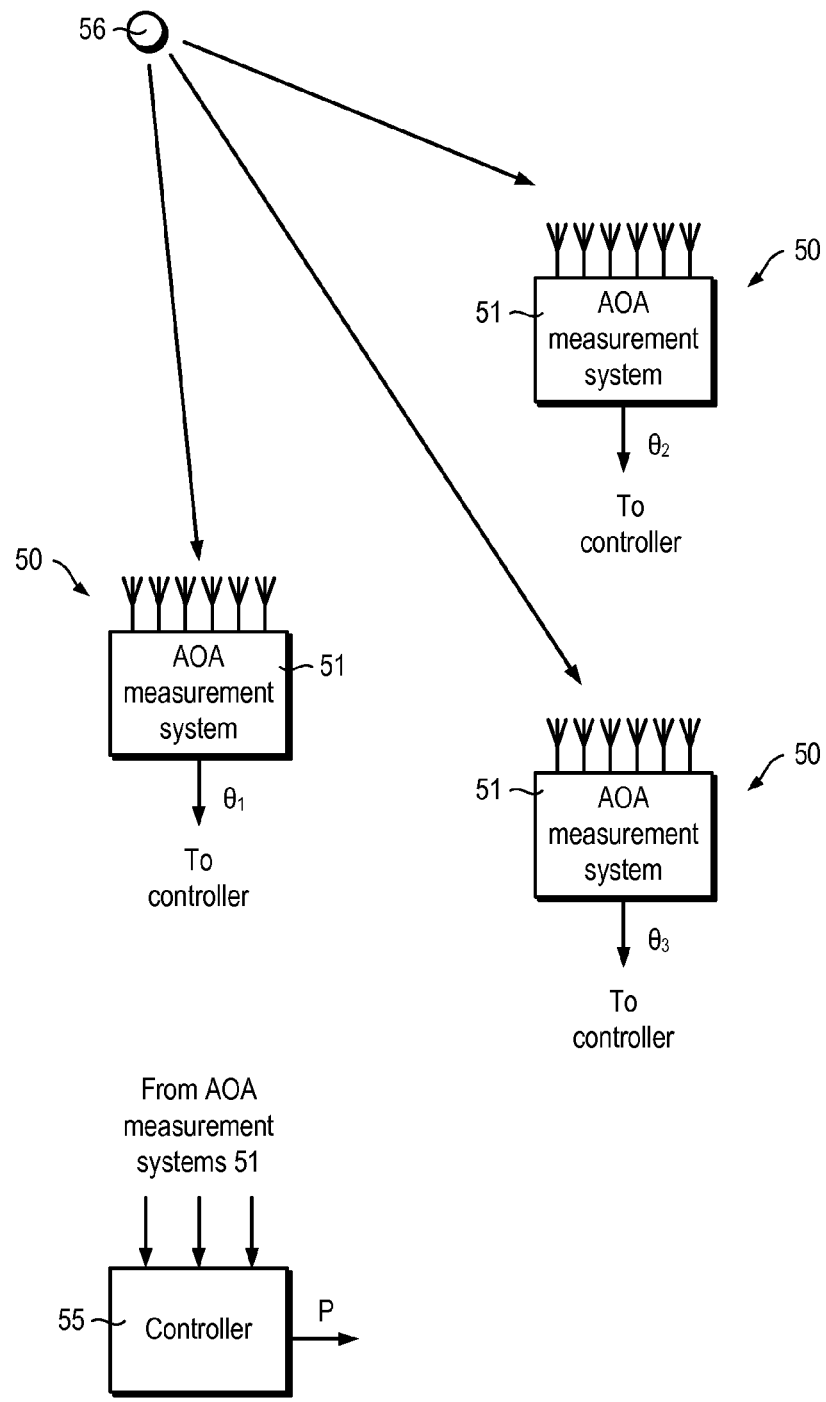
FIG. 13 is a schematic block diagram of an AOA-based positioning system comprising a plurality of AOA detection devices and a controller.

Referring also to FIG. 13, an AOA detection 54 is shown which comprises a network of geographically-distributed AOA detection devices 50 and a controller 55 which can calculate location to provide location, P, of a transmitter 56 by triangulation. The controller 55 can take the form of a computer system, such as a laptop computer or tablet.

The AOA detection devices 50 can transmit values of locally-determined angle, θ, to the controller 55 via a wired (e.g. Ethernet) or wireless (IEEE 802.11) network.

Figure 14:
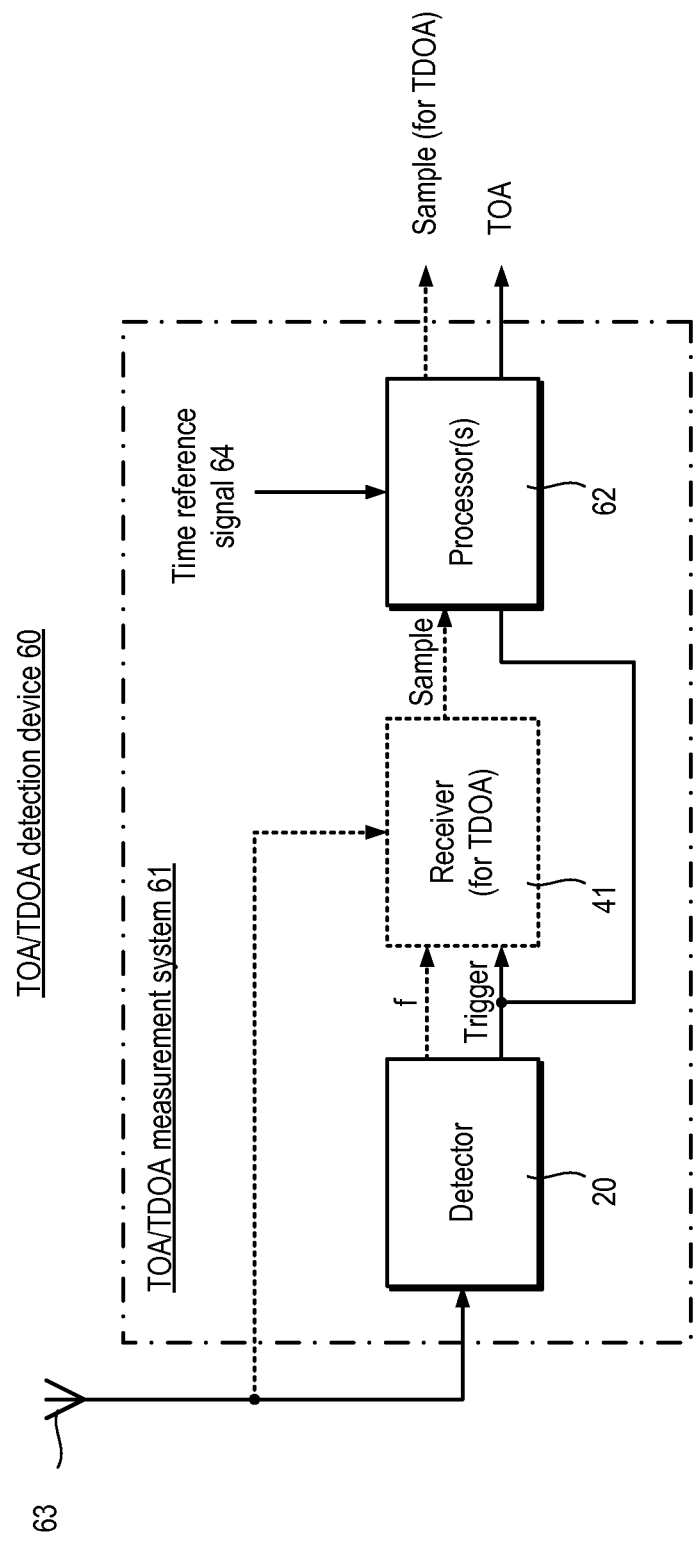
FIG. 14 is a schematic block diagram of a time-of-arrival (TOA) and/or time-difference-of-arrival (TDOA) detection device.

Referring to FIG. 14, a time-of arrival (TOA)/time-difference-of-arrival (TDOA) detection device 60 is shown.

The TOA/TDOA detection device 60 comprises a TOA/TDOA measurement system 61 which includes a detector 20, an optional receiver 41 (for TDOA) and a processor 62, and an antenna 63. The processor 62 receives a time reference signal 64.

The processor(s) 62 may comprise one or more programmable CPUs capable of executing code read from a non-transitory medium to perform the function and operations taught herein. The processor(s) 62 may be provided by microcontroller(s). The processor(s) 62 may include one or more circuits or circuitry, for example, FPGA(s) or ASIC(s) configurable or programmable to perform the functions and operations taught herein. The processor(s) 62 may include a combination of one or more programmable CPUs and one or more configurable circuits or circuitry to perform the functions and operations taught herein.

For a time-of-arrival (TOA) measurement, when a signal is detected, the detector 20 sends a trigger to the processor(s) 62 which records the time of arrival of the signal.

For a time-difference-of-arrival (TDOA) measurement, when a signal is detected, the detector 20 commands the receiver 41 to capture a sample of the signal or the remaining part of the signal. The receiver 41 feeds the sample (for example in the form of a time series) to the processor(s) 62.

The device 60 may be configured to perform TOA, TDOA or TOA and TDOA.

The device 60 may be switchable between first, second and third modes in which it performs TOA, TDOA or TOA and TDOA respectively.

The device may be able to perform other types of measurement, such as AOA.

Figure 15:
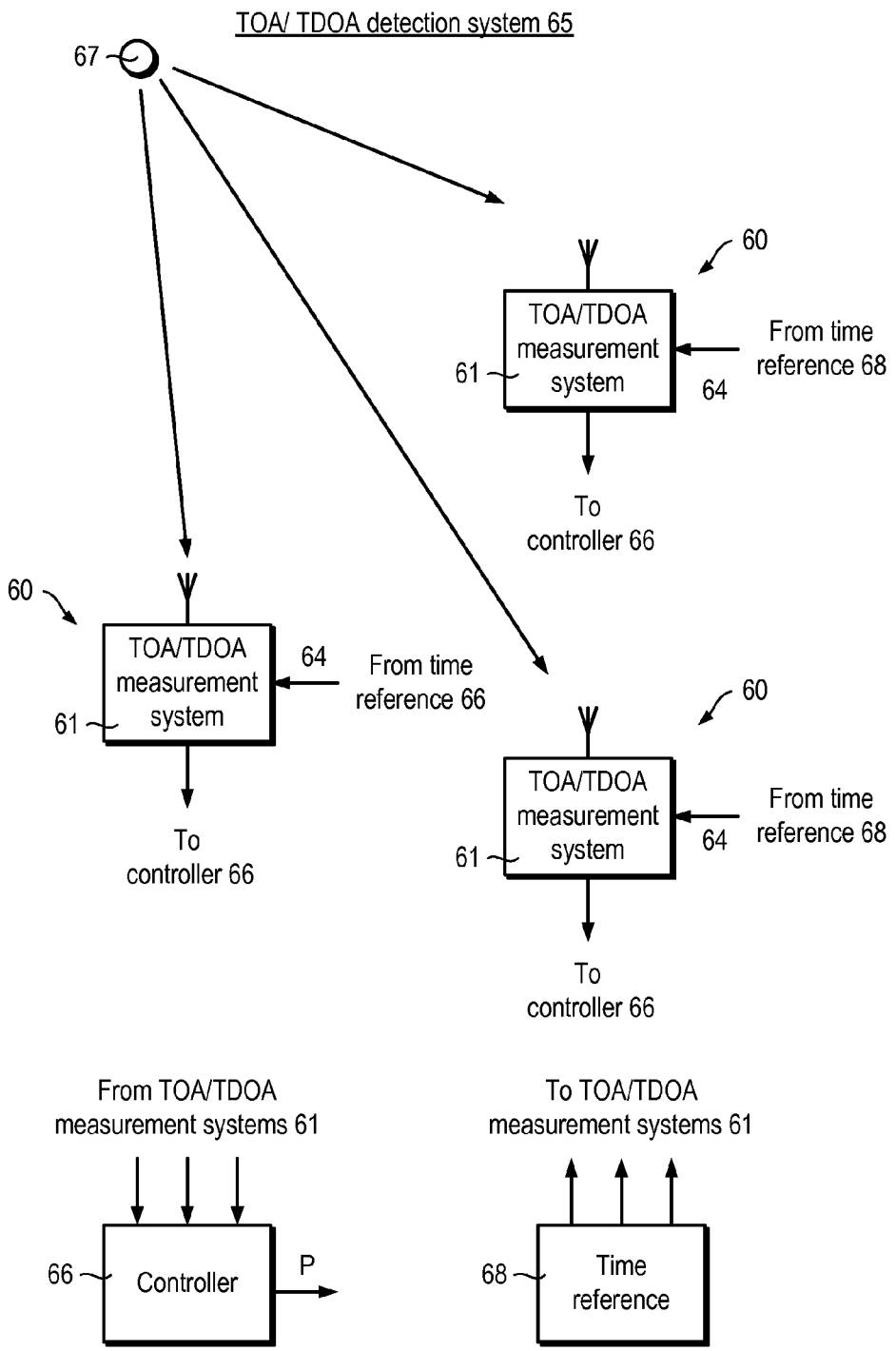
FIG. 15 is a schematic block diagram of a positioning system comprising a plurality of TOA and/or TDOA detection devices and a controller.

Referring also to FIG. 15, a TOA/TDOA detection system 65 is shown which comprises a network of geographically-distributed TOA/TDOA detection devices 60, a controller 66 which can calculate location to provide location, P, of a transmitter 67 by trilateration, and a time reference 68 which transmits a time reference signal 64. The controller 66 can take the form of a computer system, such as a laptop computer or tablet.

The TOA/TDOA detection devices 60 can transmit values of locally-determined TOA and/or a locally-captured signal sample to the controller 66 via a wired (e.g. Ethernet) or wireless (IEEE 802.11) network.

For TOA, the controller 66 determines a sphere of possible locations from each value of TOA (based on the location of the device) and can use a value of TOA from three or more devices to determine the location of the source.

For TDOA, the controller 66 performs correlation analysis on pairs of captured time series and determines a hyperbolic function for a pair of measurements. By using two or more pairs of measurements, intersection(s) of hyperbolas is (are) used to determine the location of the source.

The GPS or other positioning system can be used as time reference 68.

It will be appreciated that many modifications may be made to the embodiments hereinbefore described.

The comparison circuit in a frequency discriminator may comprise different components.

The invention claimed is:

1. A frequency discriminator comprising:
   a first power splitter for splitting a signal into first and second paths, wherein the first path is configured to provide a first, straight-through signal and the second path includes a first frequency-dependent element so as to provide a second signal,
   a first circuit configured to compare the first and second signals and generate a first instantaneous frequency signal in dependence thereon,
   a second power splitter for splitting a signal into third and fourth paths, wherein the third path is configured to provide a third, straight-through signal and the fourth path includes a second frequency-dependent element so as to provide a fourth signal,
   a second circuit configured to compare the third and fourth signals and generate a second instantaneous frequency signal in dependence thereon, and a third power splitter configured to split an input signal and feed the input signal to the first and second power splitters, wherein the first and second frequency-dependent elements have different frequency dependencies, and wherein the frequency discriminator is sensitive to signals in a bandwidth between a lower frequency limit and an upper frequency limit, wherein the upper frequency limit is 1 GHz or 40 GHz.

2. A frequency discriminator according to claim 1, wherein at least one of the frequency-dependent elements comprises a linear filter.

3. A frequency discriminator according to claim 1, wherein at least one of the frequency-dependent elements is a low-pass filter.

4. A frequency discriminator according to claim 3, wherein the low-pass filter has a corner frequency of at least 500 MHz.

5. A frequency discriminator according to claim 1, wherein at least one of the frequency-dependent elements comprises a Bessel filter.

6. A frequency discriminator according to claim 1, wherein the second path comprises more than one frequency-dependent element in series.

7. A frequency discriminator according to claim 1, wherein the first circuit comprises a first amplifier configured to amplify the first signal and a second amplifier configured to amplify the second signal.

8. A frequency discriminator according to claim 7, wherein the first and second amplifiers are first and second logarithmic amplifiers respectively.

9. A frequency discriminator according to claim 7, wherein the first circuit includes an integrated circuit comprising the first and second amplifiers.

10. A frequency discriminator according to claim 1, wherein the first circuit comprises a differential amplifier, wherein the differential amplifier is configured to compare the first and second signals or fifth and sixth signals obtained from the first and second signals respectively.

11. A frequency discriminator according to claim 10, wherein the second circuit comprises a second differential amplifier, wherein the second differential amplifier is configured to compare the third and fourth signals or seventh and eighth signals obtained from the third and fourth signals respectively.

12. A frequency discriminator according to claim 1, wherein at least one of the first circuit and the second circuit is configured to output an instantaneous amplitude signal.

13. A frequency discriminator according to claim 12, further comprising an analogue-to-digital converter arranged to sample the instantaneous amplitude signal.

14. A frequency discriminator according to claim 1, further comprising an analogue-to-digital converter arranged to sample at least one of the first instantaneous frequency signal and the second instantaneous frequency signal.

15. A frequency discriminator according to claim 1, which is a wideband frequency discriminator.

16. A frequency discriminator according to claim 1, wherein the first frequency-dependent element is a low-pass filter and the second frequency-dependent element is a high pass filter.

17. A frequency discriminator according to claim 1, further comprising a third circuit configured to compare the first and second instantaneous frequency signals.

18. A detector, comprising:
at least one frequency discriminator according to claim 1; and
a circuit configured to process signal(s) from the at least one frequency discriminator.

19. A detector, comprising:
a power splitter for splitting a signal into at least two paths, each path including a frequency discriminator according to claim 1; and
at least one processor configured to process signal(s) from the at least one frequency discriminator.

20. A detector according to claim 19, wherein each path includes a filter for selecting a respective frequency range.

21. A detector according to claim 20, comprising at least one band pass filter.

22. A detector according to claim 19, wherein each path includes an amplifier arranged to saturate for signals above a given signal level.

23. A detector according to claim 19, further comprising an input section.

24. A detector according to claim 23, wherein the input section comprises a high-pass filter.

25. A detector according to claim 23, wherein the input section comprises a power limiter.

26. A system comprising:
a detector according to claim 18 or 19;
a receiver;
wherein the detector is configured, in response to receiving a signal which includes a component at a predetermined frequency, to identify the frequency and to cause the receiver to tune to a frequency band which includes the frequency.

27. A system according to claim 26, further comprising:
at least one further processor configured to characterise the signal and, in response to characterising the signal, to generate a pulse descriptor word.

28. A system according to claim 26, further comprising:
at least one antenna coupled to the detector and the receiver.

29. A system according to claim 26, which is a radar warning receiver system.

30. A detection device comprising:
at least two detectors according to claim 18 or 19, each detector arranged to output a corresponding power level of an input signal; and
a processor configured to receive at least two measurements of power levels from respective detectors and to determine an angle of arrival.

31. A detection device according to claim 30, further comprising: at least two antennas, each antenna coupled to a respective detector.

32. A system comprising:
a plurality of spaced detection devices according to claim 30; and
a controller for receiving measurements of angle of arrival from one or more of the plurality of spaced detection devices and which is configured to determine position of a signal source from measurements of angle of arrival.

33. A detection device comprising:
a detector according to claim 18 or 19; and
at least one processor configured to measure a time of arrival of a pulse received by the detector.

34. A system comprising:
a plurality of spaced detection devices according to claim 33; and a controller for receiving measurements of time of arrival from one or more of the plurality of spaced detection devices and which is configured to determine position of a signal source from measurements of time of arrival.

35. A detection device comprising:
a detector according to claim 18 or 19;
a receiver for capturing a sample of a signal; and
at least one processor,
wherein the detector is configured, in response to receiving a signal, to cause the receiver to capture a sample of the signal.

36. A system comprising:
a plurality of spaced detection devices according to claim 35; and
a controller for receiving samples from one or more of the plurality of spaced detection devices and which is configured to determine position of a signal source from the samples using time difference of arrival.

37. A detection device according to claim 35, wherein the at least one processor is configured to measure a time of arrival of a pulse received by the detector.

38. A system comprising:
a plurality of spaced detection devices according to claim 37; and
a controller for receiving samples from one or more of the plurality of spaced detection devices and which is configured to determine position of a signal source from the samples using time difference of arrival.

39. A system according to claim 38, wherein the controller is configured to determine position of the signal source from measurements of time of arrival.

* * * * *